(12) United States Patent
Ning

(10) Patent No.: US 11,536,770 B2
(45) Date of Patent: Dec. 27, 2022

(54) CHIP TEST METHOD, APPARATUS, DEVICE, AND SYSTEM

(71) Applicant: Changxin Memory Technologies, Inc., Anhui (CN)

(72) Inventor: Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/211,475

(22) Filed: Mar. 24, 2021

(65) Prior Publication Data

US 2021/0208198 A1 Jul. 8, 2021

Related U.S. Application Data

(63) Continuation of application No. PCT/CN2019/107052, filed on Sep. 20, 2019.

(30) Foreign Application Priority Data

Sep. 28, 2018 (CN) .......................... 201811137064.0
Sep. 28, 2018 (CN) .......................... 201821631051.4

(51) Int. Cl.
*G01R 31/319* (2006.01)

(52) U.S. Cl.
CPC . *G01R 31/31908* (2013.01); *G01R 31/31905* (2013.01)

(58) Field of Classification Search
None
See application file for complete search history.

(56) References Cited

U.S. PATENT DOCUMENTS

| 6,980,009 B2 | 12/2005 | Maciejewski et al. |
| 7,076,714 B2 * | 7/2006 | Cook, III ............... G11C 29/56 714/742 |
| 7,275,187 B2 | 9/2007 | Kawasaki |

(Continued)

FOREIGN PATENT DOCUMENTS

| CN | 1489156 A | 4/2004 |
| CN | 101025996 A | 8/2007 |

(Continued)

OTHER PUBLICATIONS

PCT International Search Report and the Written Opinion dated Nov. 28, 2019, issued in related International Application No. PCT/CN2019/107052 (10 pages).

*Primary Examiner* — Guerrier Merant
(74) *Attorney, Agent, or Firm* — Sheppard Mullin Richter & Hampton LLP

(57) ABSTRACT

The present invention provides a chip test method, apparatus, device, and system. The chip test system may include: a test equipment, including n chip selection signal lines, m sets of first signal lines, and m*n sets of second signal lines; and m*n chip test sites, wherein each chip test site may be coupled to one of the n chip selection signal lines and one of the m sets of first signal lines, each of the m*n chip test sites may correspond to a unique combination of a chip selection signal line and a first signal line coupled thereto, and each chip test site may be correspondingly coupled to one of the m*n sets of second signal lines. According to an embodiment of the present invention, the limited pins of a test equipment may be used to implement individual control of multiple chips.

13 Claims, 6 Drawing Sheets

(56) References Cited

U.S. PATENT DOCUMENTS

| | | | |
|---|---|---|---|
| 7,499,364 B2 | 3/2009 | Ahn et al. | |
| RE41,016 E * | 12/2009 | Momohara | G01R 1/07342 |
| | | | 324/762.02 |
| 8,860,452 B2 * | 10/2014 | Lee | G01R 31/2601 |
| | | | 324/756.07 |
| 2004/0078740 A1 * | 4/2004 | Cook, III | G11C 29/56004 |
| | | | 714/718 |
| 2004/0225465 A1 * | 11/2004 | Pramanick | G01R 31/31907 |
| | | | 702/119 |
| 2007/0165469 A1 * | 7/2007 | Rehm | G01R 31/31926 |
| | | | 365/201 |
| 2008/0303173 A1 * | 12/2008 | Hamada | G01R 31/318544 |
| | | | 257/E21.531 |
| 2020/0200819 A1 * | 6/2020 | Malisic | G01R 1/025 |

FOREIGN PATENT DOCUMENTS

| | | |
|---|---|---|
| CN | 102890232 A | 1/2013 |
| CN | 108008284 A | 5/2018 |
| CN | 109270432 A | 1/2019 |
| CN | 208953666 U | 6/2019 |
| CN | 209215538 U | 8/2019 |

* cited by examiner

CHIP TEST METHOD, APPARATUS, DEVICE, AND SYSTEM

CROSS-REFERENCE TO RELATED APPLICATIONS

This application is a continuation application of International Patent Application No. PCT/CN2019/107052, filed on Sep. 20, 2019, which is based on and claims priority to and benefits of the Chinese Patent Application Nos. 201811137064.0 and 201821631051.4, both filed with the State Intellectual Property Office (SIPO) of the People's Republic of China on Sep. 28, 2018. The entire contents of the above-referenced applications are incorporated herein by reference.

TECHNICAL FIELD

The present invention relates to the field of semiconductors technology, and in particular to an integrated circuit (IC) chip, an IC chip test method, apparatus, device, and system capable of individually testing multiple chips.

BACKGROUND

When multiple chips are tested in the related art, in order to implement individual test on each chip, it is usually required to provide an individual chip selection line for each chip. In such a manner, when available input/output (I/O) interfaces of a test device/test equipment are limited, the test efficiency of the test equipment is reduced, and the number of the chips that can be tested by the test equipment is also reduced.

FIG. 1 is a schematic diagram of a control manner for tested chips in the related art. In the solution shown in FIG. 1, one chip selection signal line (i.e., CS) controls one row or column of tested chips, and one set of physical signal line (i.e., L) controls one column or row of tested chips. The physical signal line includes a control signal line, an address signal line, and a data signal line. However, in such a control manner, the limited pins can be used to implement simultaneous write on multiple tested chips successfully, but the simultaneous read on the multiple tested chips cannot be implemented.

Therefore, a chip test method capable of overcoming the above limitations is needed.

It is to be noted that the information disclosed in the above Background is merely for enhancing the understanding of the background of the present invention, and thus the include information does not constitute prior art known to those of ordinary skill in the art.

SUMMARY

The present invention provides a chip test method and a chip test system, to overcome the problem that a test device/test equipment cannot simultaneously read multiple tested chips due to a limitation and a defect in the related art.

One aspect of the present invention is directed to a chip test system that may include: a test equipment including m sets of first signal lines and m*n sets of second signal lines; and m*n chip test sites. Each chip test site may be coupled to one of the m sets of first signal lines and one of the m*n sets of second signal lines. The m*n chip test sites may be configured for simultaneously performing a test on one or more of the m*n chip test sites.

In an embodiment of the present invention, the test equipment may further include n chip selection signal lines, each chip test site in the m*n chip test sites may be coupled to one of the n chip selection signal lines, and each of the m*n chip test sites may correspond to a unique combination of a chip selection signal line and a first signal line coupled thereto.

In an embodiment of the present invention, the test equipment may be configured to: determine a coupling relationship between a chip test site corresponding to one or more tested chips and a signal line coupled thereto; and activate, according to the coupling relationship, a chip selection signal line coupled to the chip test site, simultaneously output a test instruction to a first signal line coupled to the chip test site, and write data or read data via a second signal line coupled to the chip test site.

In an embodiment of the present invention, each set of first signal line may include at least a control signal line and an address signal line, and each set of second signal line may include at least a data signal line.

In an embodiment of the present invention, the test equipment may be configured to: activate the n chip selection signal lines in sequence, simultaneously output a write instruction and a write address to the m sets of first signal lines, and respectively write the data to m sets of second signal lines coupled to m chip test sites currently controlled by a chip selection signal line, to implement a write test on m*n tested chips in n batches, wherein m tested chips may be simultaneously tested in each batch; or, output a write instruction and a write address to the m sets of first signal lines in sequence, simultaneously activate the n chip selection signal lines, and respectively write the data to n sets of second signal lines coupled to n chip test sites currently controlled by a first signal line, to implement a write test on m*n tested chips in m batches, wherein n tested chips may be simultaneously tested in each batch.

In an embodiment of the present invention, the test equipment may be configured to: activate the n chip selection signal lines in sequence, simultaneously output a read instruction and a read address to the m sets of first signal lines, and respectively read the data via m sets of second signal lines coupled to m chip test sites currently controlled by a chip selection signal line, to implement a read test on m*n tested chips in n batches, wherein m tested chips may be simultaneously tested in each batch; or, output a read instruction and a read address to the m sets of first signal lines in sequence, simultaneously activate the n chip selection signal lines, and respectively read the data via n sets of second signal lines coupled to n chip test sites currently controlled by a first signal line, to implement a read test on m*n tested chips in m batches, wherein n tested chips may be simultaneously tested in each batch.

In an embodiment of the present invention, the test equipment may be configured to: activate the n chip selection signal lines, simultaneously output a write instruction and a write address to the m sets of first signal lines, and write the data to the m*n sets of second signal lines, to simultaneously perform a write test on m*n tested chips; or, activate the n chip selection signal lines, simultaneously output a read instruction and a read address to the m sets of first signal lines, and respectively read the data via the m*n sets of second signal lines, to simultaneously perform a read test on m*n tested chips.

In an embodiment of the present invention, the m*n chip test sites are arranged in a m*n matrix.

Another aspect of the present invention is directed to a chip test method that may be configured for testing m*n chips. Each of the m*n chips may be coupled to one of m sets of first signal lines of a test equipment. Each chip may be correspondingly coupled to one of m*n sets of second signal lines, and the chip test method may include: determining a coupling relationship between a signal line and a tested chip coupled thereto; and simultaneously outputting, according to the coupling relationship, a test instruction to a first signal line coupled to the tested chip, and writing data or reading data via a second signal line coupled to the tested chip.

In an embodiment of the present invention, each set of first signal line may include a control signal line and an address signal line, and each set of second signal line may include a data signal line.

In an embodiment of the present invention, each of the m*n chips may be coupled to one of n chip selection signal lines, and each of the m*n chip test sites may correspond to a unique combination of a chip selection signal line and a first signal line coupled thereto.

In an embodiment of the present invention, the simultaneously outputting a test instruction to a first signal line coupled to the tested chip, and writing data or reading data via a second signal line coupled to the tested chip may include: activating a chip selection signal line coupled to the tested chip, simultaneously outputting, according to the coupling relationship, the test instruction to the first signal line coupled to the tested chip, and writing the data or reading the data via the second signal line coupled to the tested chip.

In an embodiment of the present invention, the chip test method may further include: activating the n chip selection signal lines in sequence, simultaneously outputting a write instruction and a write address to the m sets of first signal lines, and respectively writing the data to m sets of second signal lines coupled to m chips currently controlled by a chip selection signal line, to implement a write test on m*n tested chips in n batches, wherein m tested chips may be simultaneously tested in each batch; or, outputting a write instruction and a write address to the m sets of first signal lines in sequence, simultaneously activating the n chip selection signal lines, and respectively writing the data to n sets of second signal lines coupled to n chips currently controlled by a first signal line, to implement a write test on m*n tested chips in m batches, wherein n tested chips may be simultaneously tested in each batch.

In an embodiment of the present invention, the chip test method may further include: activating the n chip selection signal lines in sequence, simultaneously outputting a read instruction and a read address to the m sets of first signal lines, and respectively reading the data via m sets of second signal lines coupled to m chips currently controlled by a chip selection signal line, to implement a read test on m*n tested chips in n batches, wherein m tested chips may be simultaneously tested in each batch; or, outputting a read instruction and a read address to the m sets of first signal lines in sequence, simultaneously activating the n chip selection signal lines, and respectively reading the data via n sets of second signal lines coupled to n chips currently controlled by a first signal line, to implement a read test on m*n tested chips in m batches, wherein n tested chips may be simultaneously tested in each batch.

In an exemplary embodiment of the present invention, the chip test method may further include: activating the n chip selection signal lines, simultaneously outputting a write instruction and a write address to the m sets of first signal lines, and writing the data to the m*n sets of second signal lines, to simultaneously perform a write test on m*n tested chips; or, activating the n chip selection signal lines, simultaneously outputting a read instruction and a read address to the m sets of first signal lines, and respectively reading the data via the m*n sets of second signal lines, to simultaneously perform a read test on m*n tested chips.

Another aspect of the present invention is directed to a chip test apparatus that may be configured to test m*n chips. Each of the m*n chips may be coupled to one of m sets of first signal lines of a test equipment and one of n chip selection signal lines, and each of the m*n chip test sites may correspond to a unique combination of a chip selection signal line and a first signal line coupled thereto. Each chip may be coupled to one set of m*n sets of second signal lines of the test equipment, and the chip test apparatus may include: a test solution determination module, configured to determine a signal line coupled relationship of a tested chip; and a test instruction output module, configured to activate, according to the signal line coupled relationship, a chip selection signal line coupled to the tested chip, simultaneously output a test instruction to a first signal line coupled to the tested chip, and write data or read data via a second signal line coupled to the tested chip.

Another aspect of the present invention is directed to a chip test equipment that may include: n chip selection signal lines, m sets of first signal lines and m*n sets of second signal lines; a memory; and a processor coupled to the memory. The processor may be configured to execute an instruction stored in the memory, to implement the chip test method according to any one of the above.

Another aspect of the present invention is directed to a non-transitory computer readable storage medium. The computer readable storage medium may store a program, which, when being executed by a processor, may implement the chip test method according to any one of the above.

According to the chip test method, the chip test equipment, and the chip test system provided by the embodiments of the present invention, by arranging chip test sites in an m*n matrix, and coupling each chip test site to a different data signal line, the limited pins of a test equipment may be used to implement individual control of more tested chips and simultaneously read more tested chips.

It is to be understood that both the foregoing general description and the following detailed description are exemplary and explanatory only and are not necessarily restrictive to the present invention.

BRIEF DESCRIPTION OF DRAWINGS

The accompanying drawings, which are incorporated in and constitute a part of the specification, illustrate embodiments of the present invention, and together with the specification, serve to explain the principles of the present invention. Apparently, the accompanying drawings in the following description are only a portion of embodiments of the present invention, and those of ordinary skill in the art can derive other drawings from the accompanying drawings without creative efforts.

DESCRIPTION OF EMBODIMENTS

Figure 1:
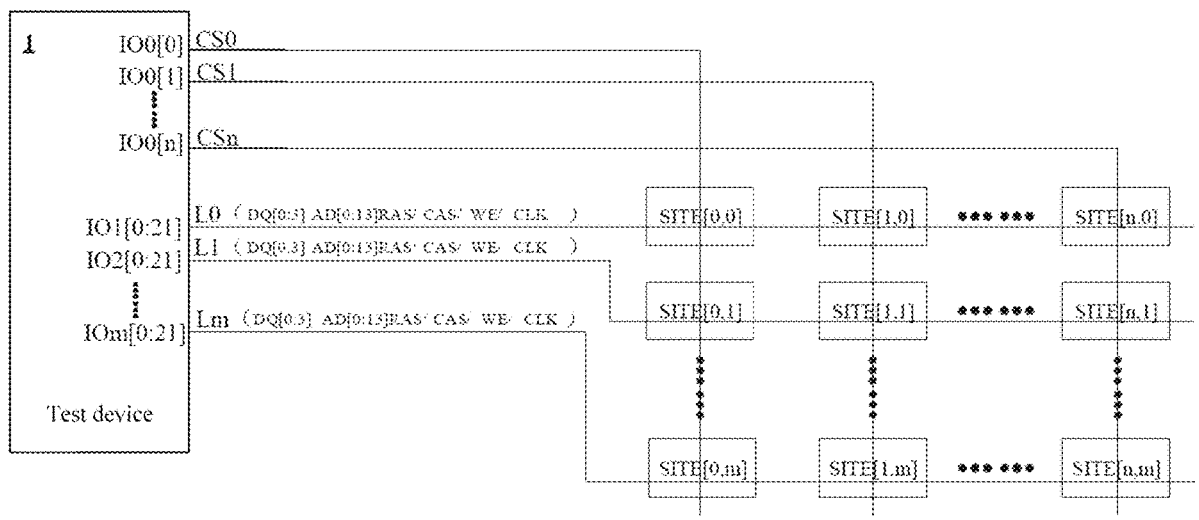
FIG. 1 is a schematic diagram of a multi-chip test system in the related art.

The embodiments of the present invention will be described more completely in conjunction with the accompanying drawings. However, the embodiments can be implemented in various forms, and should not be considered as limitation to the embodiments described herein. Instead, these embodiments are provided to thoroughly and completely describe the present invention, and to fully convey the concepts of the embodiments for those skilled in the art. The described characteristics, structures, or properties may be combined in one or more embodiments in any manners. In the following description, details are provided for fully understanding the embodiments of the present invention. However, it would be obvious to those skilled in the art that one or more of the particular details may be omitted in the practice of the technical solutions of the present invention, or other methods, components, apparatuses, steps, and the like may be adopted. In other cases, the known technical solutions are not illustrated or described in detail to prevent distracting and obscuring the aspects of the present invention.

Additionally, the accompanying drawings include schematic diagrams of the present invention. The identical reference symbols in the drawings represent identical or similar parts, and therefore, the repeated descriptions thereof are omitted. Some block diagrams in the accompanying drawings are functional entities, which do not necessarily correspond to physically or logically independent entities. These functional entities may be implemented in a software form, or implemented in one or more hardware modules or integrated circuits, or in different networks, and/or processor apparatuses and/or microcontroller apparatuses.

The embodiments of the present invention are described below in detail with reference to the accompanying drawings.

Figure 2A:
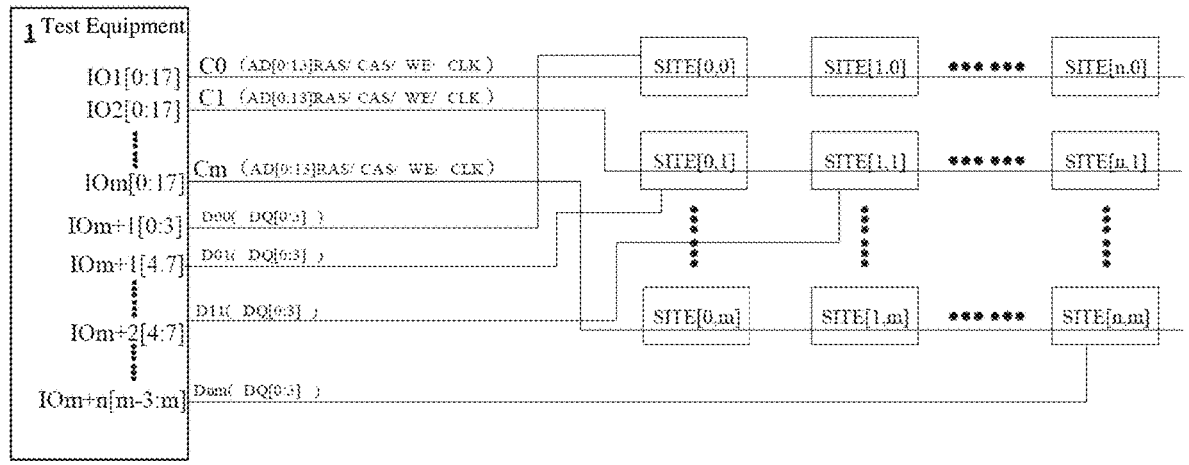
FIG. 2A and FIG. 2B are diagrams of a chip test system in an embodiment of the present invention.
Figure 2B:
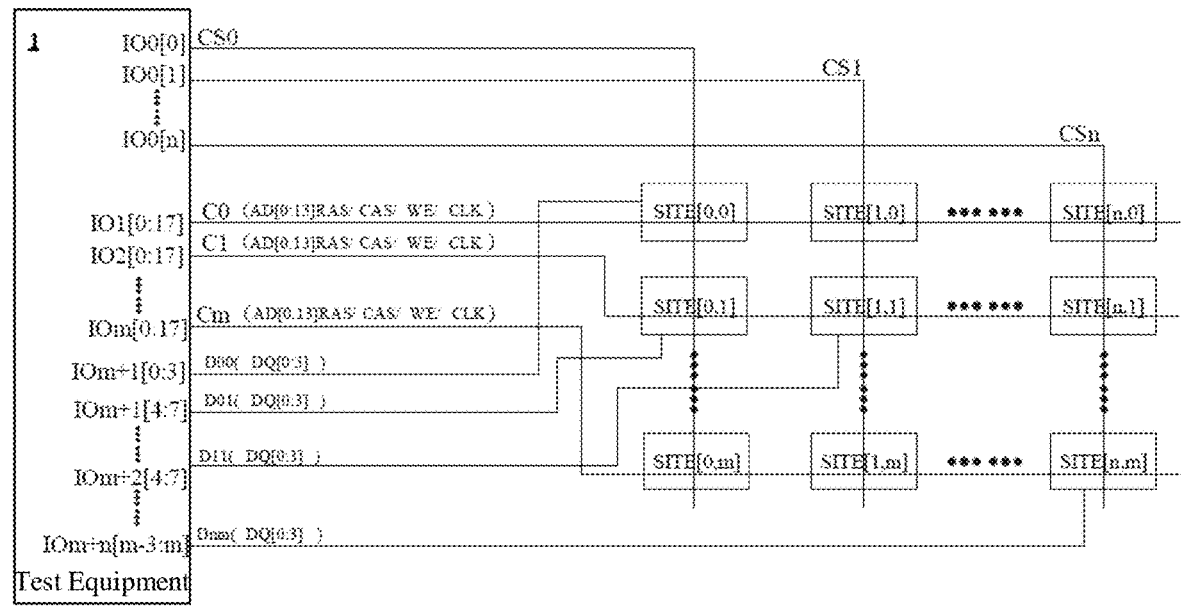

FIG. 2A and FIG. 2B are diagrams of connection of a chip test system in an embodiment of the present invention.

Referring to FIG. 2A in this embodiment of the present invention, the chip test system 200 may include: a test equipment 1, having m sets of first signal lines C0-Cm, and m*n sets of second signal lines D00-Dmn; and m*n chip test sites SITE [0, 0] to SITE [n, m], wherein each chip test site is coupled to one set of the m sets of first signal lines Cy and one set of the m*n sets of second signal lines, i.e., each chip test site corresponds to one of the second signal lines.

Referring to FIG. 2B in this embodiment of the present invention, the chip test system 200 may include: a test equipment 1, having n chip selection signal lines CS0-CSn, m sets of first signal lines C1-Cm, and m*n sets of second signal lines D00-Dmn; and m*n chip test sites SITE [0, 0] to SITE [n, m], wherein each chip test site is coupled to one of the n chip selection signal lines CSx and one set of the m sets of first signal lines Cy; each of the m*n chip test sites corresponds to a unique combination of a chip selection signal line and a first signal line coupled thereto; and each chip test site is correspondingly coupled to one set of the m*n sets of second signal lines, i.e., each of the chip test sites corresponds to one of the second signal lines.

In the embodiments shown in FIG. 2A and FIG. 2B, each chip test site is arranged in an m*n matrix for the ease of description and explanation. In other embodiments, chip test site may also be arranged in other manners, which is not particularly limited by the present invention thereto.

In addition, in the embodiments shown in FIG. 2A and FIG. 2B, each set of first signal line may include a control signal line CMD (i.e., RAS, CAS, WE, and CLK) and an address signal line AD, and each set of second signal line may include a set of data signal line DQ. In other embodiments, the first signal line may also be arranged in other manners, and the second signal line may further include other types of signal lines besides the data signal line. In an embodiment of the present invention, in order to save pins of the test equipment as much as possible, the set of second signal line only includes the set of data signal line. In other embodiments, the types and numbers of the signal lines included in the first signal line and the second signal line may be determined by those skilled in the art at discretion.

As shown in FIG. 2A, the test equipment 1 may individually control a tested chip via the following manner: determining a coupling relationship of a signal line and a chip test site corresponding to one or more tested chips; simultaneously outputting, according to the coupling relationship, a test instruction to a first signal line coupled to the tested chip, and writing data via a second signal line coupled to the tested chip.

For example, when a chip corresponding to a chip test site SITE [2, 3] needs to be tested individually, the test instruction may be output to a first signal line C3 coupled to the chip test site SITE [2, 3], and the data may be written or read via a second signal line D23 coupled to the chip test site SITE [2, 3]. At this time, other tested chips also coupled to the first signal line C3 may fail to respond to the test instruction due to that the data is not detected. Therefore, only the test instruction and the data for the tested chip corresponding to the chip test site SITE [2, 3] can be simultaneously detected to response the test instruction for implementing the individual test.

As shown in FIG. 2B, the test equipment 1 may individually control a tested chip via the following manner: determining a coupling relationship between a signal line and a chip test site corresponding to one or more tested chips; activating, according to the coupling relationship, a chip selection signal line coupled to the tested chip; and simultaneously outputting a test instruction to a first signal line coupled to the tested chip, and writing data or reading data via a second signal line coupled to the tested chip.

For example, when a tested chip corresponding to a chip test site SITE [2, 3] needs to be tested individually, a chip selection signal line CS2 coupled to the chip test site SITE [2, 3] may be activated, the test instruction may be output to a first signal line C3 coupled to the chip test site SITE [2, 3], and the data may be written or read via a second signal line D23 coupled to the chip test site SITE [2, 3]. At this time, other tested chips also coupled to the chip selection signal line CS2 may not receive the test instruction and may not respond to the test instruction. Other tested chips also coupled to the first signal line C3 do not detect a chip selection signal and do not respond to the test instruction. Therefore, only the chip selection signal and the test instruction for the tested chip corresponding to the chip test site SITE [2, 3] can be simultaneously detected to respond the test instruction for implementing the individual test. Meanwhile, since the chip test site SITE [2, 3] is connected to the test equipment 1 via the unique set of data signal line D23, even though the test equipment 1 may read multiple chip test sites simultaneously, data of the tested chip corresponding to the chip test site SITE [2, 3] may be buffered in data registers and can be read accurately without a data conflict with other tested chips.

In some embodiments, the chip test system shown in FIG. 2B may implement multiple test solutions for simultaneously or individually writing or reading multiple tested chips.

When write to m*n tested chips in n batches and m tested chips are simultaneously written in each batch, the n chip selection signal lines may be activated in sequence, a write instruction and a write address may be simultaneously output to the m sets of first signal lines, and the data may be written respectively to the m sets of second signal lines coupled to the m chips currently controlled by a chip selection signal line. Alternatively, a write instruction and a write address may be output to the m sets of first signal lines in sequence, the n chip selection signal lines may be simultaneously activated, and the data may be written respectively to n sets of second signal lines coupled to n chips currently controlled by a first signal line, to implement the test on the m*n tested chips in m batches, wherein n tested chips are simultaneously tested in each batch.

When read from m*n tested chips in n batches and m tested chips are simultaneously tested in each batch, the n chip selection signal lines may be activated in sequence, a read instruction and a read address are simultaneously output to the m sets of first signal lines, and the data may be respectively read via m sets of second signal lines coupled to the m chips currently controlled by a chip selection signal line. Alternatively, a read instruction and a read address may be output to the m sets of first signal lines in sequence, the n chip selection signal lines may be simultaneously activated, and the data may be respectively read via n sets of second signal lines coupled to n chips currently controlled by a first signal line, to implement the read test on the m*n tested chips in m batches, wherein n tested chips are simultaneously tested in each batch.

If the write test or the read test needs to be performed on one or more tested chips in a row of chips, one chip selection signal line may be activated, the test instruction may be output to a first signal line coupled to the tested chips, and the data may be written or read via a second signal line coupled to each tested chip. Alternatively, if one or more tested chips in a series of chips need to be tested, several chip selection signal lines coupled to the tested chips may be activated, the test instruction may be output to one set of first signal lines, and the data may be written or read via a second signal line coupled to each tested chip.

Certainly, all chip selection signal lines may be simultaneously activated, the test instruction may be output to all first signal lines, and the data may be written or read via all second signal lines to test all chips simultaneously.

As shown in the above structures, the chip test systems provided by the embodiments of the present invention may use limited I/O pins to test multiple chips and to read multiple chips simultaneously coupled thereto.

Figure 3A:
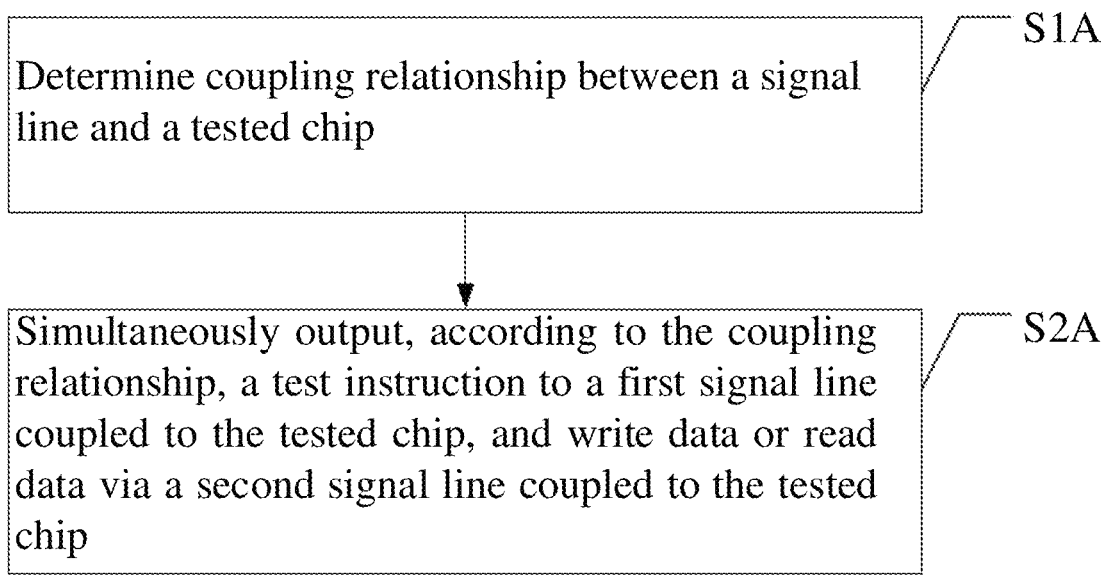
FIG. 3A and FIG. 3B are flowcharts of a chip test method in an embodiment of the present invention.
Figure 3B:
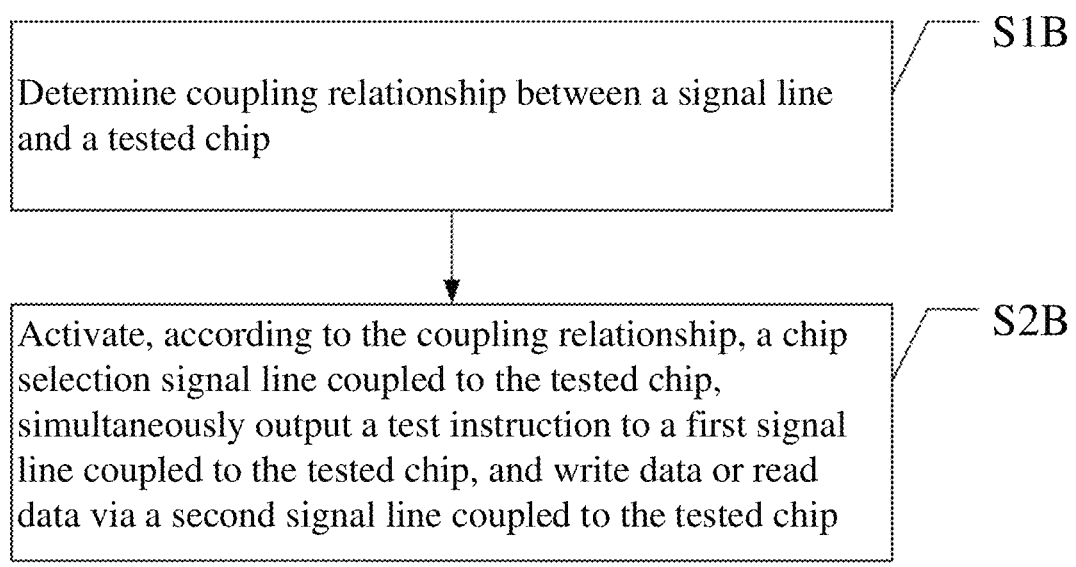

FIG. 3A and FIG. 3B are flowcharts of a chip test method provided by an embodiment of the present invention. The chip test methods shown in FIG. 3A and FIG. 3B may be respectively applied to the test systems shown in FIG. 2A and FIG. 2B.

Referring to FIG. 3A, the chip test method may include the following steps.

Step S1A: determine coupling relationship between a signal line and a tested chip.

Step S2A: simultaneously output, according to the coupling relationship, a test instruction to a first signal line coupled to the tested chip, and write data or read data via a second signal line coupled to the tested chip.

Referring to FIG. 3B, the chip test method may include the following steps.

Step S1B: determine a coupling relationship between a signal line and a tested chip.

Step S2B: activate, according to the coupling relationship, a chip selection signal line coupled to the tested chip, simultaneously output a test instruction to a first signal line coupled to the tested chip, and write data or read data via a second signal line coupled to the tested chip.

The chip test method shown in FIG. 3B may be used to test one or more of the m*n tested chips.

For example, when a write test needs to be performed on the m*n tested chips in n batches and m tested chips are simultaneously written in each batch, n chip selection signal lines may be activated in sequence, a write instruction and a write address may be simultaneously output to m sets of first signal lines, and the data may be respectively written to m sets of second signal lines coupled to the m chips currently controlled by a chip selection signal line. Alternatively, a write instruction and a write address may be output to the m sets of first signal lines in sequence, the n chip selection signal lines may be simultaneously activated, and the data may be respectively written to n sets of second signal lines coupled to n chips currently controlled by a first signal line, to implement the test on the m*n tested chips in m batches, where n tested chips are simultaneously tested in each batch.

When a read test needs to be performed on the m*n tested chips in n batches and m tested chips are simultaneously tested in each batch, the n chip selection signal lines may be activated in sequence, a read instruction and a read address may be simultaneously output to the m sets of first signal lines, and the data may be respectively read via m sets of second signal lines coupled to the m chips currently controlled by a chip selection signal line. Alternatively, a read instruction and a read address may be output to the m sets of first signal lines in sequence, the n chip selection signal lines may be simultaneously activated, and the data may be respectively read via n sets of second signal lines coupled to n chips currently controlled by a first signal line, to implement the read test on the m*n tested chips in m batches, where n tested chips are simultaneously tested in each batch.

Figure 4:
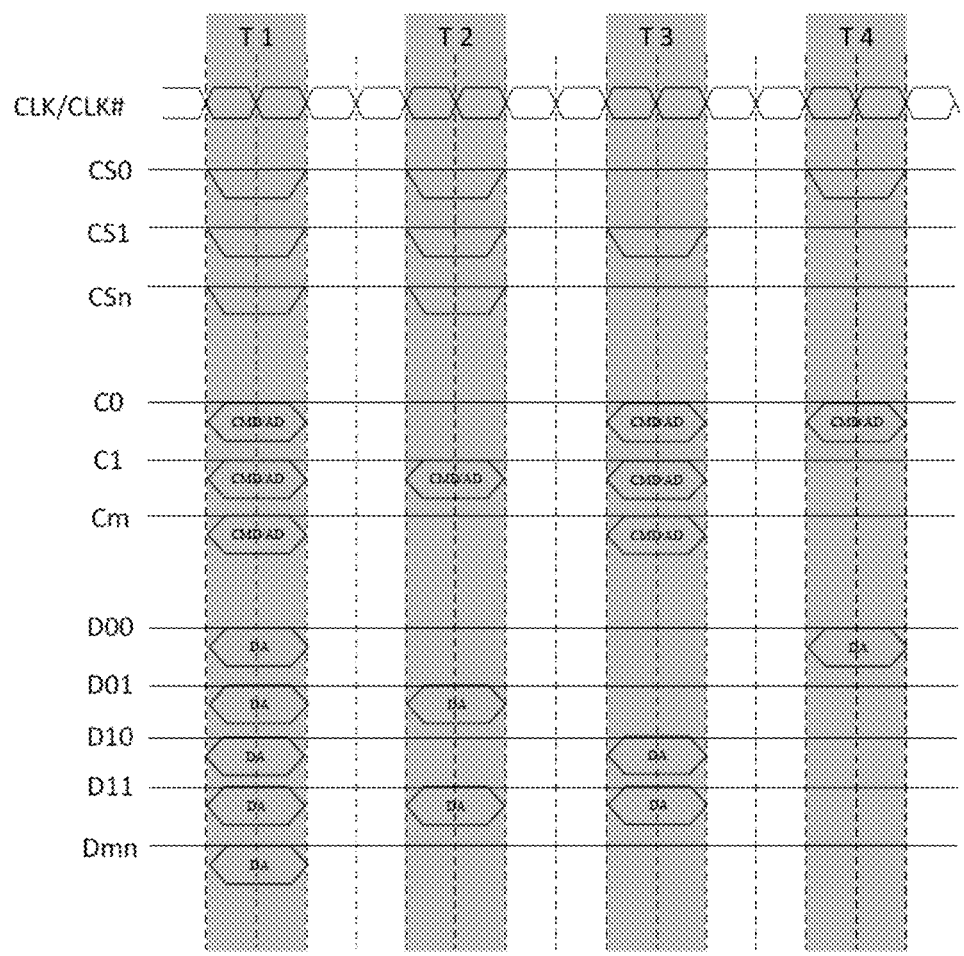
FIG. 4 is a timing diagram of a chip test method in an embodiment of the present invention.

FIG. 4 is a timing diagram of a chip test method in an embodiment of the present invention.

Referring to FIG. 4, at the T1 moment, all chip selection signal lines are activated simultaneously, a test instruction is output to all first signal lines, and data is written or read simultaneously via all second signal lines, so that all chips may be tested at the same time.

At the T2 moment, if one or more chips in one row of chips need to be tested, multiple chip selection signal lines coupled to the tested chips may be activated, the test instruction may be output to one set of first signal line, and the data may be written or read via second signal lines coupled to the tested chips.

At the T3 moment, if one or more chips in one column of chips need to be tested, one chip selection signal line may be activated, the test instruction may be output to a first signal line coupled to the tested chips, and the data may be written or read via second signal lines coupled to the tested chips.

At the T4 moment, if one chip needs to be tested, a chip selection signal line coupled to the chip may be activated, the test instruction may be output to a first signal line coupled to the chip, and the data may be written or read via a second signal line coupled to the chip.

If multiple chips need to be tested in a scrambled order and the number of tested chips each time is not the same, multiple tested chips and a test sequence for the multiple tested chips may be determined according to a test solution, then a chip selection signal line, a first signal line, and a second signal line coupled to each tested chip may be determined. After all, according to the test sequence, one or more chip selection signal lines currently coupled to the tested chips may be simultaneously activated, a test instruction may be simultaneously output to a first signal line currently coupled to the tested chips, and the data may be written or read via second signal lines coupled to the tested chips.

According to the methods provided by the embodiments of the present invention, each chip selection signal line controls multiple tested chips, each set of first signal line controls multiple tested chips, and each tested chip is coupled to the test equipment via an independent set of second signal line, so that the limited number of pins may be used to individually control more chips for implementing simultaneous read and write multiple tested chips.

Corresponding to the above embodiments, the present invention further provides a chip test equipment, which may be configured to execute the above methods.

Figure 5:
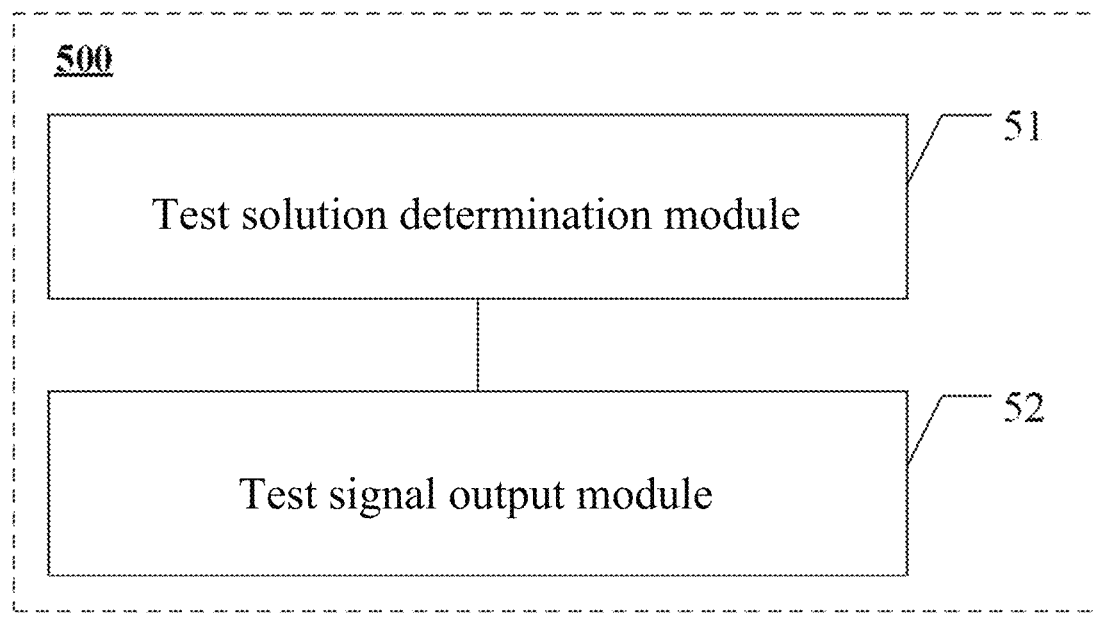
FIG. 5 is a block diagram of a chip test apparatus in an embodiment of the present invention.

FIG. 5 is a block diagram of a chip test apparatus in an embodiment of the present invention. The chip test apparatus 500 is configured to test m*n tested chips, each of the m*n tested chips is coupled to one set of m sets of first signal lines of a test equipment and one of n chip selection signal lines, each of the m*n chip test sites corresponds to a unique combination of a chip selection signal line and a first signal line coupled thereto, and each chip is coupled to one set of m*n sets of second signal lines of the test equipment.

Referring to FIG. 5, the chip test apparatus 500 may include: a test solution determination module 51, configured to determine a coupling relationship between a signal line and a tested chip; and a test instruction output module 52, configured to activate, according to the coupling relationship, a chip selection signal line coupled to the tested chip, simultaneously output a test instruction to a first signal line coupled to the tested chip, and write data or read data via a second signal line coupled to the tested chip.

In an embodiment of the present invention, the first signal line includes a control signal line and an address signal line, and the second signal line includes a data signal line.

In an embodiment of the present invention, the test instruction output module 52 is further configured to: activate the n chip selection signal lines in sequence, simultaneously output a write instruction and a write address to the m sets of first signal lines, and respectively write the data to m sets of second signal lines coupled to m chips currently controlled by a chip selection signal line, to implement write test on m*n tested chips in n batches, wherein m tested chips are simultaneously tested in each batch; or, output a write instruction and a write address to the m sets of first signal lines in sequence, simultaneously activate the n chip selection signal lines, and respectively write the data to n sets of second signal lines coupled to n chips currently controlled by a first signal line, to implement write test on m*n tested chips in m batches, where n tested chips are simultaneously tested in each batch.

In an embodiment of the present invention, the test instruction output module 52 is further configured to: activate the n chip selection signal lines in sequence, simultaneously output a write instruction and a write address to the m sets of first signal lines, and respectively write the data to m sets of second signal lines coupled to m chips currently controlled by a chip selection signal line, to implement write test on m*n tested chips in n batches, where m tested chips are simultaneously tested in each batch; or, output a write instruction and a write address to the m sets of first signal lines in sequence, simultaneously activate the n chip selection signal lines, and respectively write the data to n sets of second signal lines coupled to n chips currently controlled by a first signal line, to implement write test on m*n tested chips in m batches, where n tested chips are simultaneously tested in each batch.

In an embodiment of the present invention, the test instruction output module 52 is further configured to: activate the n chip selection signal lines in sequence, simultaneously output a write instruction and a write address to the m sets of first signal lines, and write the data to the m*n sets of second signal lines, to simultaneously perform write test on m*n tested chips; or, activate the n chip selection signal lines, simultaneously output a read instruction and a read address to the m sets of first signal lines, and respectively read the data via the m*n sets of second signal lines, to simultaneously perform read test on m*n tested chips.

Each function of the apparatus 500 has been described in detail in the corresponding method according to the above embodiments and thus will not be repeated herein.

It is to be noted that a plurality of modules or units of a device for executing an action is mentioned in the detailed description, but such divisions are not mandatory. As a matter of fact, according to the embodiments of the present invention, the characteristics and functions of the above two or more modules or units may be implemented in one module or unit. On the other hand, the characteristics and functions of the above described one module or unit may be further divided and implemented via multiple modules or units.

In an embodiment of the present invention, there is further provided a chip test equipment capable of implementing the above method.

To those skilled in the art, aspects of the present invention may be implemented as a system, method, or program product. Accordingly, the aspects of the present invention may be implemented as an embodiment of hardware, an embodiment of software (including firmware, micro-code, etc.,) or an embodiment combining software and hardware, that may all generally be referred as a "circuit," "module," or "system."

The chip test equipment 600 according to this embodiment of the present invention is described below with reference to FIG. 6. The chip test equipment 600 shown in FIG. 6 is merely an example, and should not form any limitation to the ranges of functions and services of this embodiment of the present invention.

Figure 6:
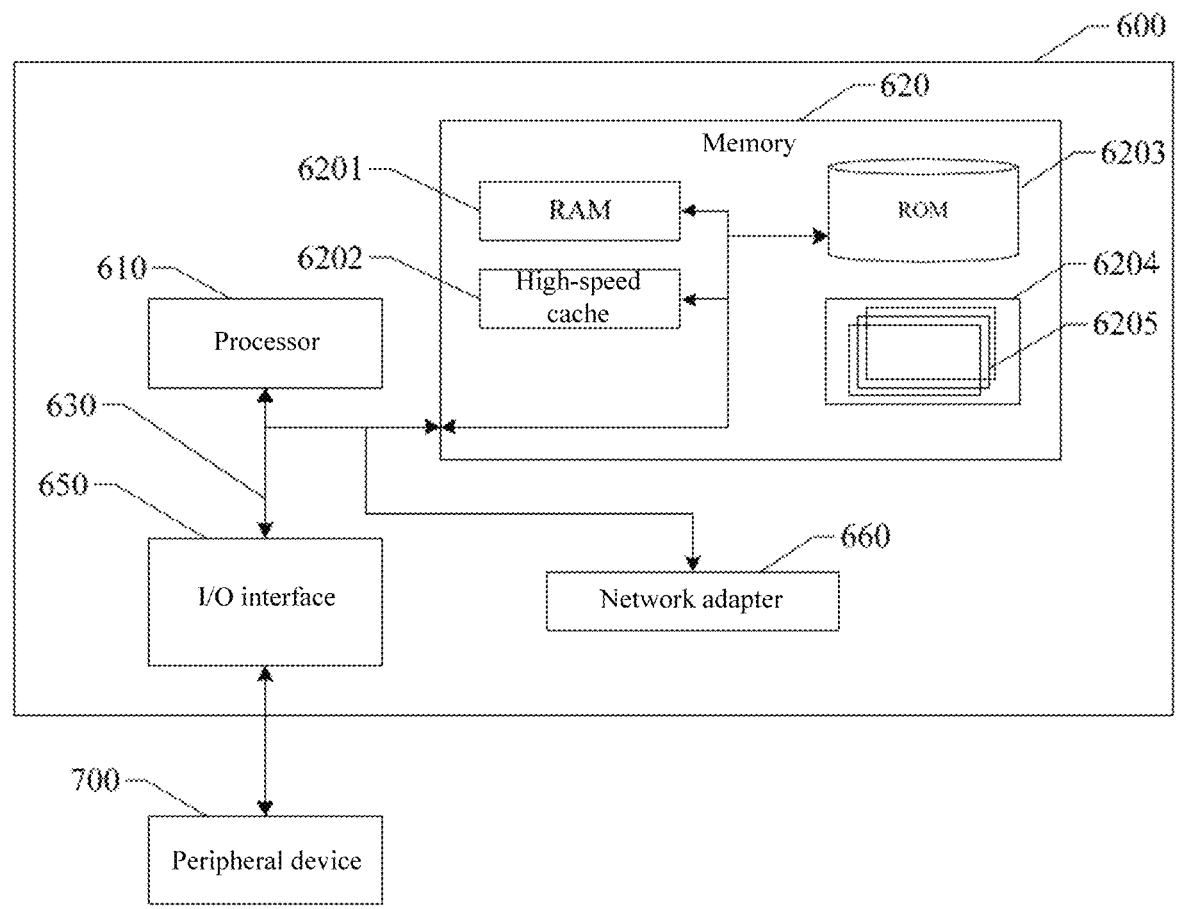
FIG. 6 is a block diagram of a chip test equipment in an embodiment of the present invention.

As shown in FIG. 6, the chip test equipment 600 is embodied in a form of a general computer device. Components of the chip test equipment 600 may include, but not limited to, at least one processor 610, at least one memory 620, and a bus 630 connecting different system components (including the memory 620 and the processor 610).

The memory 620 stores at least a program code. The program code may be executed by the processor 610 to implement the steps described in the methods of the specification, according to various embodiments of the present invention. For example, the processor 610 may execute each step in the embodiment shown in FIG. 3.

The memory 620 may include a computer readable medium in a form of a volatile memory, such as a random-access memory (EAM) 6201 and/or a high-speed cache memory 6202, and may further include a read-only memory (ROM) 6203.

The memory 620 may further include a program/utility tool 6204 having a group of (at least one) program modules 6205. The program modules 6205 includes, but not limited to, an operation system, one or more application programs, other program modules, and program data. In these examples, the implementation of a network environment may be included in each or some combination.

The bus 630 may represent one or more types of bus structures, including a memory bus or a memory controller, a peripheral bus, an accelerated graphics port, a processor, or local bus using any of a variety of bus structures.

The chip test equipment 600 may communicate with one or more peripheral devices 700 (for example, a keyboard, a pointing device, and a Bluetooth device,) one or more devices that enable a user to interact with the chip test equipment 600, and/or any device (for example, a router, and a modem) that enables the chip test equipment 600 to communicate with one or more other computing devices. Such communication may be performed via an I/O interface 650. Moreover, the chip test equipment 600 may further communicate with one or more networks (for example, a local area network (LAN), a Wide Area Network (WAN), and/or a public network like Internet) via a network adapter 660. As illustrated in the figure, the network adapter 660 communicates with other modules of the chip test equipment 600 via the bus 630. It is to be understood that, although not shown in figure, other hardware and/or software modules may be used in combination with the chip test equipment 600, including but not limited to, a microcode, a device driver, a redundancy processor, an external disk driving array, a redundant array of independent disks (RAID) system, a magnetic tape driver, and a data backup storage system, etc.

With the description on the above embodiments, it is easily understood by those skilled in the art that the embodiments described herein may be implemented via software, and may also be implemented in a combination of software and necessary hardware. Therefore, the technical solutions according to the embodiments of the present invention may be embodied in the form of a software product. The software product may be stored on a nonvolatile storage medium (which may be a CD-ROM, a U disk, a mobile hard disk, etc.) or a network, and may include a plurality of instructions to enable a set of computing devices (which may be a personal computer, a server, a terminal device, or a network device, etc.) to execute the method according to the embodiments of the present invention.

In an embodiment of the present invention, there is further provided a computer readable storage medium, which stores a program product capable of implementing the above method in the specification. In some embodiments, each aspect of the present invention may further be implemented as a form of a program product. The program product includes at least a program code. When the program product is run on a terminal device, the program code is configured to enable the terminal device to execute the steps in the methods of the specification according to each embodiment of the present invention.

Figure 7:
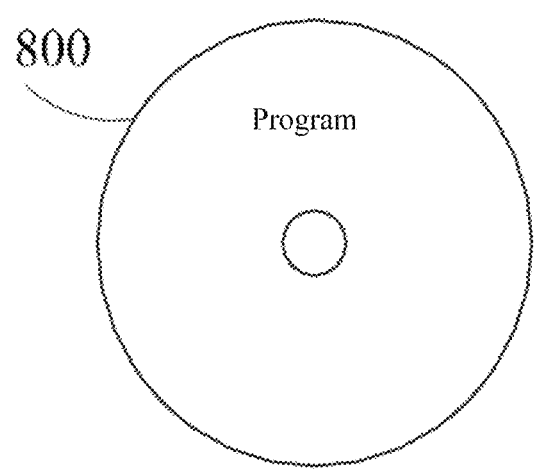
FIG. 7 is a schematic diagram of a storage medium according to the present invention.

Referring to FIG. 7, a program product 800 configured for implementing the above method according to an embodiment of the present invention is depicted. The program product may use a portable compact disc read-only memory (CD-ROM) and include at least a program code, and may be run on a terminal device such as a personal computer. However, the program product in the present invention is not limited to this. In embodiments of the present invention, the readable storage medium may be any tangible medium that includes or stores a program for use by or in connection with an instruction execution system, apparatus, or device.

Any combination of one or more readable media may be utilized by the program product. The readable medium may be a readable signal medium or a readable storage medium. For example, the readable storage medium may be, but not limited to, an electronic, magnetic, optical, electromagnetic, infrared, or semiconductor system, apparatus, or device, or any combination of the foregoing. More examples (a non-exhaustive list) of the readable storage medium may include an electrical connection having one or more wires, a portable diskette, a hard disk, a random-access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing.

The computer readable signal medium may include a propagated data signal carrying a readable program code in a baseband or as part of a carrier wave. Such a propagated data signal may be in a variety of forms, including, but not limited to, an electromagnetic signal, an optical signal, or any suitable combination of the foregoing. The readable signal medium may be any readable medium that is not a readable storage medium and that can send, propagate, or transmit a program for use by or in connection with an instruction execution system, apparatus, or device.

The program code embodied on a readable medium may be transmitted using any appropriate medium, including but not limited to wireless, wireline, optical fiber cable, RF, and the like, or any suitable combination of the foregoing.

The program code for executing operations of the present invention may be written in any combination of one or more programming languages, including object-oriented programming languages such as Java, C++, or the like, and conventional procedural programming languages such as the "C" language or similar programming languages. The program code may be executed entirely on a user's computing device, executed partially on a user device, executed as a stand-alone software package, executed partially on the user's computing device and partially on a remote computing device, or executed entirely on the remote computing device or a server. In a scenario involving the remote computing device, the remote computing device may be connected to an external computing device through any type of network, including a local area network (LAN) or a wide area network (WAN), or the connection may be made to an external computing device, for example, through an Internet using an Internet service provider.

In addition, the above accompanying drawings are merely schematic descriptions of processes included in the method according to the embodiment of the present invention and are not intended to limit the present invention. It is easily understood that the processes in the accompanying drawings do not indicate or limit a time sequence of these processes. Additionally, it is also easily understood that these processes may be, for example, executed in multiple modules synchronously or asynchronously.

Other embodiments of the present invention will be obvious to those skilled in the art from consideration of the specification and practice of the present invention disclosed herein. The present invention covers any variations, uses, or adaptations of the present invention following the general principles thereof, and includes any departures from the present invention as come within known or customary practice in the art. The specification and examples are considered to be exemplary only. A true scope and spirit of the present invention are indicated by the claims.

What is claimed is:

1. A chip test system, comprising:
    a test equipment comprising m sets of first signal lines and m*n sets of second signal lines;
    m*n chip test sites, each chip test site being coupled to one set of the m sets of first signal lines and one set of the m*n sets of second signal lines, wherein the m*n chip test sites are configured for simultaneously performing a test on one or more of m*n chips; and
    n chip selection signal lines, each of the m*n chip test sites is coupled to one of the n chip selection signal lines, and each of the m*n chip test sites corresponds to a unique combination of a chip selection signal line and a first signal line coupled thereto;
    wherein the test equipment is configured to:
    determine a coupling relationship between a chip test site corresponding to one or more tested chips and a signal line coupled thereto;
    activate, according to the coupling relationship, a chip selection signal line coupled to the chip test site, simultaneously output a test instruction to a first signal line coupled to the chip test site, and write data or read data via a second signal line coupled to the chip test site;
    activate the n chip selection signal lines in sequence, simultaneously output a write instruction and a write address to the m sets of first signal lines, and respectively write the data to m sets of second signal lines coupled to m chip test sites currently controlled by a chip selection signal line, to implement a write test on m*n tested chips in n batches, wherein m tested chips are simultaneously tested in each batch; or
    output a write instruction and a write address to the m sets of first signal lines in sequence, simultaneously activate the n chip selection signal lines, and respectively write the data to n sets of second signal lines coupled to n chip test sites currently controlled by a first signal line, to implement a write test on m*n tested chips in m batches, wherein n tested chips are simultaneously tested in each batch.

2. The chip test system according to claim 1, wherein each set of the m sets of first signal line comprises at least a control signal line and an address signal line, and each set of the m*n sets of second signal line comprises at least a data signal line.

3. The chip test system according to claim 1, wherein the test equipment is configured to:
    activate the n chip selection signal lines in sequence, simultaneously output a read instruction and a read address to the m sets of first signal lines, and respectively read the data via m sets of second signal lines coupled to m chip test sites currently controlled by a chip selection signal line, to implement a read test on m*n tested chips in n batches, wherein m tested chips are simultaneously tested in each batch; or
    output a read instruction and a read address to the m sets of first signal lines in sequence, simultaneously activate the n chip selection signal lines, and respectively read the data via n sets of second signal lines coupled to n chip test sites currently controlled by a first signal line, to implement a read test on m*n tested chips in m batches, wherein n tested chips are simultaneously tested in each batch.

4. The chip test system according to claim 1, wherein the test equipment is configured to:
    activate the n chip selection signal lines, simultaneously output a write instruction and a write address to the m sets of first signal lines, and write the data to the m*n sets of second signal lines, to simultaneously perform a write test on m*n tested chips; or
    activate the n chip selection signal lines, simultaneously output a read instruction and a read address to the m sets of first signal lines, and respectively read the data via the m*n sets of second signal lines, to simultaneously perform a read test on m*n tested chips.

5. The chip test system according to claim 1, wherein the m*n chip test sites are arranged in a m*n matrix.

6. A chip test method, configured for testing m*n chips at m*n chip test sites, the chip test method comprising:
    coupling each of the m*n chips to one set of m sets of first signal lines of a test equipment and one set of m*n sets of second signal lines;
    determining a coupling relationship between a signal line and a tested chip coupled thereto;
    simultaneously outputting, according to the coupling relationship, a test instruction to a first signal line coupled to the tested chip, and writing data or reading data via a second signal line coupled to the tested chip;
    activating the n chip selection signal lines in sequence, simultaneously outputting a write instruction and a write address to the m sets of first signal lines, and respectively writing the data to m sets of second signal lines coupled to m chips currently controlled by a chip selection signal line, to implement a write test on m*n tested chips in n batches, wherein m tested chips are simultaneously tested in each batch; or
    outputting a write instruction and a write address to them sets of first signal lines in sequence, simultaneously activating the n chip selection signal lines, and respectively writing the data to n sets of second signal lines coupled to n chips currently controlled by a first signal line, to implement a write test on m*n tested chips in m batches, wherein n tested chips are simultaneously tested in each batch;
    wherein each chip is coupled to one of n chip selection signal lines of the test equipment, and each of the m*n chip test sites corresponds to a unique combination of a chip selection signal line and a first signal line coupled thereto.

7. The chip test method according to claim 6, wherein each set of first signal line comprises at least a control signal line and an address signal line, and each set of second signal line comprises at least a data signal line.

8. The chip test method according to claim 6, wherein simultaneously outputting the test instruction to the first signal line coupled to the tested chip, and writing data or reading data via the second signal line coupled to the tested chip comprises:
    activating a chip selection signal line coupled to the tested chip, simultaneously outputting, according to the coupling relationship, the test instruction to the first signal line coupled to the tested chip, and writing the data or reading the data via the second signal line coupled to the tested chip.

9. The chip test method according to claim 6, further comprising:
    activating the n chip selection signal lines in sequence, simultaneously outputting a read instruction and a read address to the m sets of first signal lines, and respectively reading the data via m sets of second signal lines coupled to m chips currently controlled by a chip selection signal line, to implement a read test on m*n tested chips in n batches, wherein m tested chips are simultaneously tested in each batch; or outputting a read instruction and a read address to the m sets of first signal lines in sequence, simultaneously activating the n chip selection signal lines, and respectively reading the data via n sets of second signal lines coupled to n chips currently controlled by a first signal line, to implement a read test on m*n tested chips in m batches, wherein n tested chips are simultaneously tested in each batch.

10. The chip test method according to claim 6, further comprising:

activating the n chip selection signal lines, simultaneously outputting a write instruction and a write address to the m sets of first signal lines, and writing the data to the m*n sets of second signal lines, to simultaneously perform a write test on m*n tested chips; or activating the n chip selection signal lines, simultaneously outputting a read instruction and a read address to the m sets of first signal lines, and respectively reading the data via the m*n sets of second signal lines, to simultaneously perform a read test on m*n tested chips.

11. A chip test apparatus, configured to test m*n chips at m*n chip test sites, the chip test apparatus comprising:

a test solution determination module, configured to determine a coupling relationship between a signal line and a tested chip coupled thereto, wherein the test chip is included in the m*n chips, each of the m*n chips is coupled to one set of m sets of first signal lines of a test equipment and one of n chip selection signal lines, each chip is coupled to one set of m*n sets of second signal lines of the test equipment, the n chip selection signal lines respectively coupled to the m*n chips are not the same, and the first signal lines respectively coupled to the m*n chips are not the same; and a test instruction output module, configured to activate, according to the coupling relationship, a chip selection signal line coupled to the tested chip, simultaneously output a test instruction to a first signal line coupled to the tested chip, and write data or read data via a second signal line coupled to the tested chip;

wherein the test equipment is configured to:

activate the n chip selection signal lines in sequence, simultaneously output a write instruction and a write address to the m sets of first signal lines, and respectively write the data to m sets of second signal lines coupled to m chip test sites currently controlled by a chip selection signal line, to implement a write test on m*n tested chips in n batches, wherein m tested chips are simultaneously tested in each batch; or output a write instruction and a write address to the m sets of first signal lines in sequence, simultaneously activate the n chip selection signal lines, and respectively write the data to n sets of second signal lines coupled to n chip test sites currently controlled by a first signal line, to implement a write test on m*n tested chips in m batches, wherein n tested chips are simultaneously tested in each batch;

wherein each chip is coupled to one of n chip selection signal lines of the test equipment, and each of the m*n chip test sites corresponds to a unique combination of a chip selection signal line and a first signal line coupled thereto.

12. A chip test equipment, comprising:

n chip selection signal lines, m sets of first signal lines, and m*n sets of second signal lines;

a memory; and a processor coupled to the memory, wherein the processor is configured to execute an instruction stored in the memory, to perform operations including:

determining a coupling relationship between a signal line and a tested chip coupled thereto, wherein the tested chip is included in m*n chips at m*n chip test sites, each of the m*n chips is coupled to one set of the m sets of first signal lines and one set of the m*n sets of second signal lines;

simultaneously, according to the coupling relationship, outputting a test instruction to a first signal line coupled to the tested chip, and writing data or reading data via a second signal line coupled to the tested chip;

activating the n chip selection signal lines in sequence, simultaneously outputting a write instruction and a write address to the m sets of first signal lines, and respectively writing the data to m sets of second signal lines coupled to m chips currently controlled by a chip selection signal line, to implement a write test on m*n tested chips in n batches, wherein m tested chips are simultaneously tested in each batch; or outputting a write instruction and a write address to them sets of first signal lines in sequence, simultaneously activating the n chip selection signal lines, and respectively writing the data to n sets of second signal lines coupled to n chips currently controlled by a first signal line, to implement a write test on m*n tested chips in m batches, wherein n tested chips are simultaneously tested in each batch;

wherein each chip is coupled to one of n chip selection signal lines of the test equipment, and each of the m*n chip test sites corresponds to a unique combination of a chip selection signal line and a first signal line coupled thereto.

13. A non-transitory computer readable storage medium storing a program, when being executed by a processor to cause the processor to perform operations including:

determining a coupling relationship between a signal line and a tested chip coupled thereto, wherein the tested chip is included in m*n chips at m*n chip test sites, each of the m*n chips is coupled to one set of the m sets of first signal lines and one set of the m*n sets of second signal lines;

simultaneously outputting, according to the coupling relationship, a test instruction to a first signal line coupled to the tested chip, and writing data or reading data via a second signal line coupled to the tested chip;

activating the n chip selection signal lines in sequence, simultaneously outputting a write instruction and a write address to the m sets of first signal lines, and respectively writing the data to m sets of second signal lines coupled to m chips currently controlled by a chip selection signal line, to implement a write test on m*n tested chips in n batches, wherein m tested chips are simultaneously tested in each batch; or outputting a write instruction and a write address to them sets of first signal lines in sequence, simultaneously activating the n chip selection signal lines, and respectively writing the data to n sets of second signal lines coupled to n chips currently controlled by a first signal line, to implement a write test on m*n tested chips in m batches, wherein n tested chips are simultaneously tested in each batch;

wherein each chip is coupled to one of n chip selection signal lines of the test equipment, and each of the m*n chip test sites corresponds to a unique combination of a chip selection signal line and a first signal line coupled thereto.

* * * * *